(12) United States Patent
Yoon et al.

(10) Patent No.: US 11,589,486 B2
(45) Date of Patent: Feb. 21, 2023

(54) DISPLAY DEVICE

(71) Applicant: LG DISPLAY CO., LTD., Seoul (KR)

(72) Inventors: EunSup Yoon, Paju-si (KR); Jun Park, Paju-si (KR); SeungHyun Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/550,395

(22) Filed: Dec. 14, 2021

(65) Prior Publication Data
US 2022/0210958 A1    Jun. 30, 2022

(30) Foreign Application Priority Data

Dec. 30, 2020    (KR) .......................... 10-2020-0187054

(51) Int. Cl.
| | |
|---|---|
| *H05K 7/02* | (2006.01) |
| *H05K 7/04* | (2006.01) |
| *H05K 9/00* | (2006.01) |
| *H05K 5/00* | (2006.01) |
| *H05K 5/02* | (2006.01) |
| *H01L 51/52* | (2006.01) |
| *H01L 27/32* | (2006.01) |

(52) U.S. Cl.
CPC ......... *H05K 9/0054* (2013.01); *H05K 5/0017* (2013.01); *H01L 27/3244* (2013.01); *H01L 51/5259* (2013.01); *H01L 2251/5338* (2013.01); *H05K 5/0226* (2013.01)

(58) Field of Classification Search
USPC .......................................................... 361/807
See application file for complete search history.

(56) References Cited

U.S. PATENT DOCUMENTS

| | | | |
|---|---|---|---|
| 11,229,128 B2 * | 1/2022 | Kim ...................... | H05K 5/0017 |
| 2019/0037716 A1 * | 1/2019 | Kim ...................... | H05K 5/0217 |

FOREIGN PATENT DOCUMENTS

| | | |
|---|---|---|
| KR | 10-2020-0034207 A | 3/2020 |
| KR | 10-2091432 | 3/2020 |

\* cited by examiner

Primary Examiner — Hung S. Bui
(74) Attorney, Agent, or Firm — Polsinelli PC

(57) ABSTRACT

A display device includes a display part including a display panel in which a plurality of pixels is defined, a roller fastened with the display part and configured to wind or unwind the display part, a roller support unit configured to support the roller at both sides of the roller, and a first grounding unit including a body accommodated inside the roller so as to be movable and a contact portion connected to an outer surface of the body and brought into contact with the roller support unit as the body moves, thus maintaining and enhancing continuity of grounding and maximizing the effect of improving EMI.

20 Claims, 13 Drawing Sheets

DISPLAY DEVICE

CROSS-REFERENCE TO RELATED APPLICATION

This application claims the priority of Korean Patent Application No. 10-2020-0187054 filed on Dec. 30, 2020, which is hereby incorporated by reference in its entirety.

BACKGROUND

Field of the Disclosure

The present disclosure relates to a display device, and more particularly, to a rollable display device which is resistant to electromagnetic interference (EMI) by enhancing grounding.

Description of the Background

Display devices employed by the monitor of a computer, a TV, a mobile phone or the like include an organic light emitting display (OLED) device that emits light by itself, a liquid crystal display (LCD) device that requires a separate light source, and the like.

As the display devices have been increasingly applied to diverse fields such as a computer monitor, a TV, and a personal mobile device, display devices having a large display area and a reduced volume and weight have been studied.

Recently, a rollable display device in which a display part, lines, etc. are formed on a flexible substrate made of flexible plastic and which can display an image even when rolled up has attracted attention as a next-generation display device.

SUMMARY

Accordingly, the present disclosure is to provide a display device capable of improving operation reliability by improving the structure of a roller unit and enhancing grounding.

The present disclosure is not limited to the above-mentioned feature, which is not mentioned above, can be clearly understood by those skilled in the art from the following descriptions.

According to an aspect of the present disclosure, the display device includes a display part including a display panel in which a plurality of pixels is defined. The display device also includes a roller fastened with the display part and configured to wind or unwind the display part. The display device further includes a roller support unit configured to support the roller at both sides of the roller. The display device also includes a first grounding unit including a body accommodated inside the roller so as to be movable and a contact portion connected to an outside of the body and brought into contact with the roller support unit as the body moves.

According to another aspect of the present disclosure, the display device includes a display part including a display panel that displays images and a back cover that is disposed on a rear surface of the display panel. The display device also includes a roller fastened with the back cover and configured to wind or unwind the display part and a roller support unit configured to support the roller at both sides of the roller. The display device further includes a first grounding unit accommodated inside the roller so as to be movable and configured to be brought into contact with the roller support unit when the display part is unwound. The display device also includes a second grounding unit disposed under the roller and the roller support unit and configured to be brought into contact with the roller or the roller support unit after the display part is unwound.

Other detailed matters of the exemplary aspects are included in the detailed description and the drawings.

According to the present disclosure, a grounding unit configured to be movable is further provided inside a roller, and a grounding unit is further provided under the roller to enhance grounding. Thus, it is possible to improve operation reliability.

According to the present disclosure, continuity of grounding is maintained and enhanced. Thus, it is possible to maximize the effect of improving EMI.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
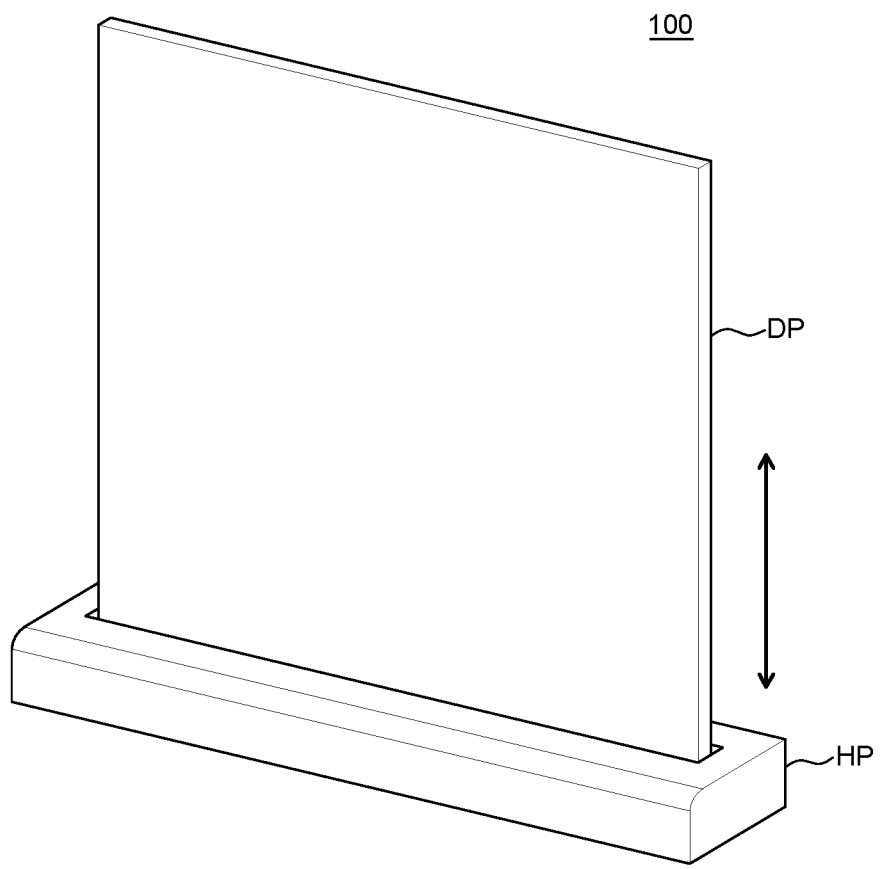
FIG. 1A and FIG. 1B are schematic perspective views of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, exemplary aspects of the present disclosure will be described in detail with reference to accompanying drawings.

<Display Device—A Rollable Display Device>

A rollable display device may also be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
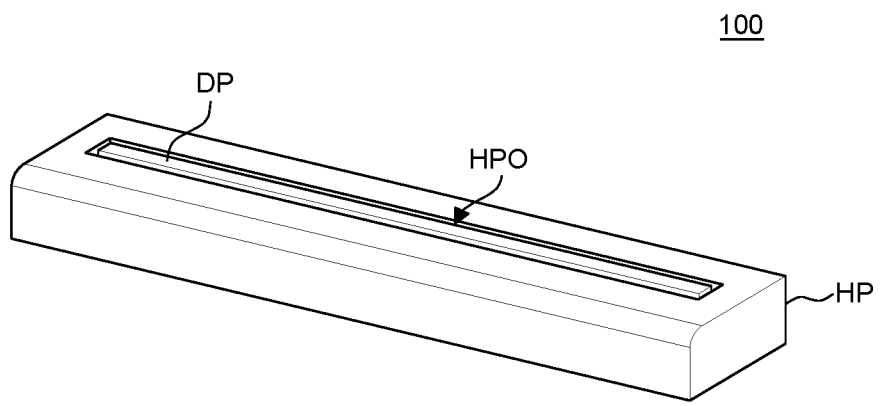

FIG. 1A and FIG. 1B are schematic perspective views of a display device according to an exemplary aspect of the present disclosure.

Referring to FIG. 1A and FIG. 1B, a display device 100 according to an exemplary aspect of the present disclosure includes a display part DP and a housing part HP.

The display part DP is configured to display images to a user. For example, display elements, circuits for driving the display elements, lines, and other components may be disposed in the display part DP. The display device 100 according to an aspect of the present disclosure is a rollable display device 100. Therefore, the display part DP may be configured to be wound and unwound. The display part DP may include a display panel and a back cover which are flexible so as to be wound or unwound, but is not limited thereto. More details of the display part DP will be described later with reference to FIG. 4 and FIG. 5.

The housing part HP serves as a case where the display part DP may be accommodated. The display part DP may be wound and then accommodated inside the housing part HP, and the display part DP may be unwound and then disposed outside the housing part HP.

The housing part HP includes an opening HPO through which the display part DP may move in and out of the housing part HP. The display part DP may move up and down through the opening HPO of the housing part HP.

The display part DP of the display device 100 may transit from a fully unwound state to a fully wound state, and vice versa.

FIG. 1A shows a fully unwound state of the display part DP of the display device 100. The fully unwound state refers to a state where the display part DP of the display device 100 is disposed outside the housing part HP. That is, the fully unwound state may be defined as a state where the display part DP is unwound to a maximum so as not to be further unwound and disposed outside the housing part HP in order for the user to watch images on the display device 100.

Also, FIG. 1B shows a fully wound state of the display part DP of the display device 100. The fully wound state refers to a state where the display part DP of the display device 100 is accommodated inside the housing part HP and cannot be further wound. That is, the fully wound state may be defined as a state where the display part DP is wound and accommodated inside the housing part HP when the user does not watch images on the display device 100 because the display part DP accommodated inside the housing part HP may be for the sake of external appearance. Further, in the fully wound state where the display part DP is accommodated inside the housing part HP, the display device 100 is reduced in volume and easy to transport.

A driving part configured to wind or unwind the display part DP is disposed to switch the display part DP to the fully unwound state or the fully wound state.

<Driving Part>

Figure 2:
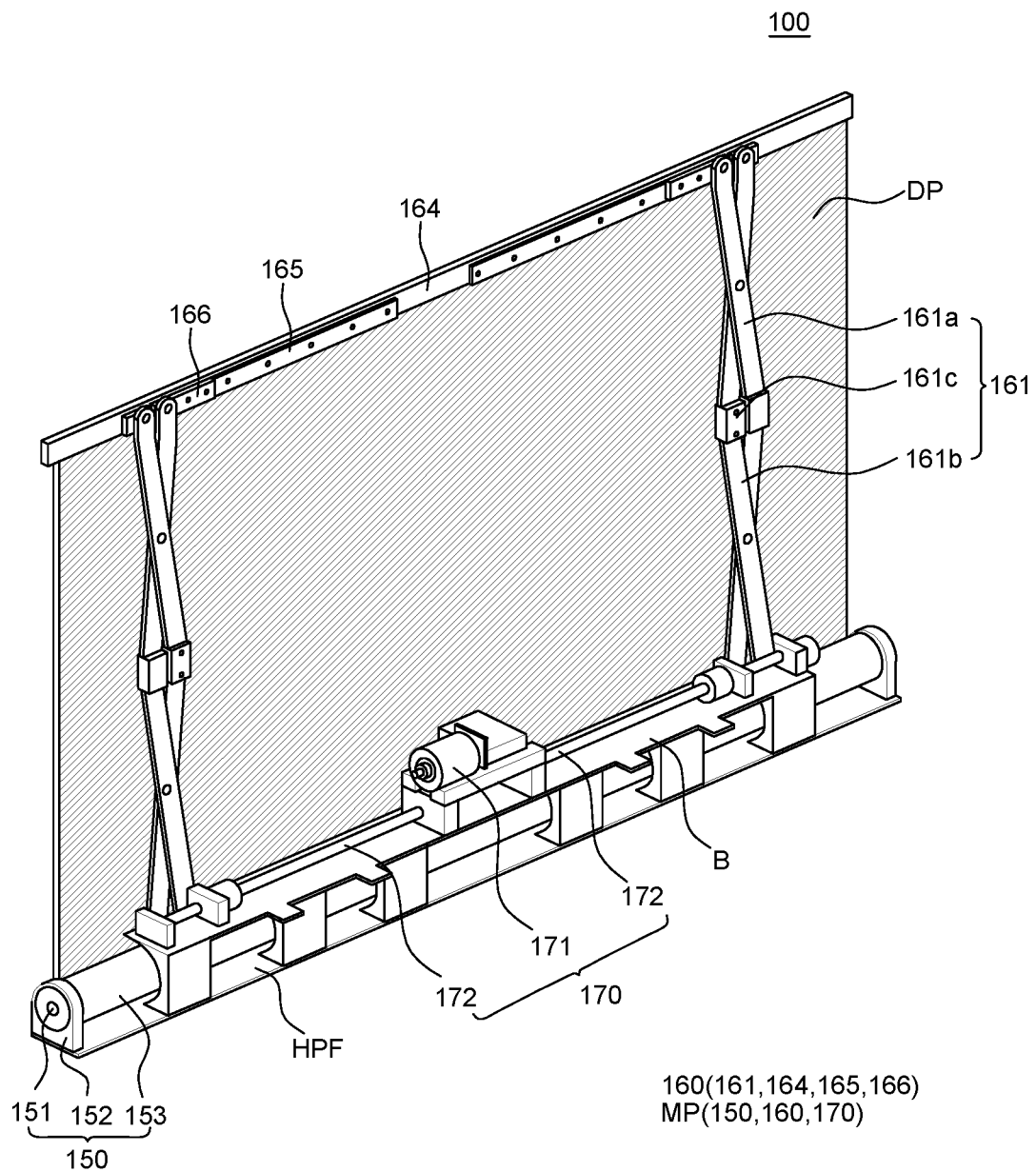
FIG. 2 is a perspective view of the display device according to an exemplary aspect of the present disclosure.

FIG. 2 is a perspective view of the display device according to an exemplary aspect of the present disclosure.

Figure 3:
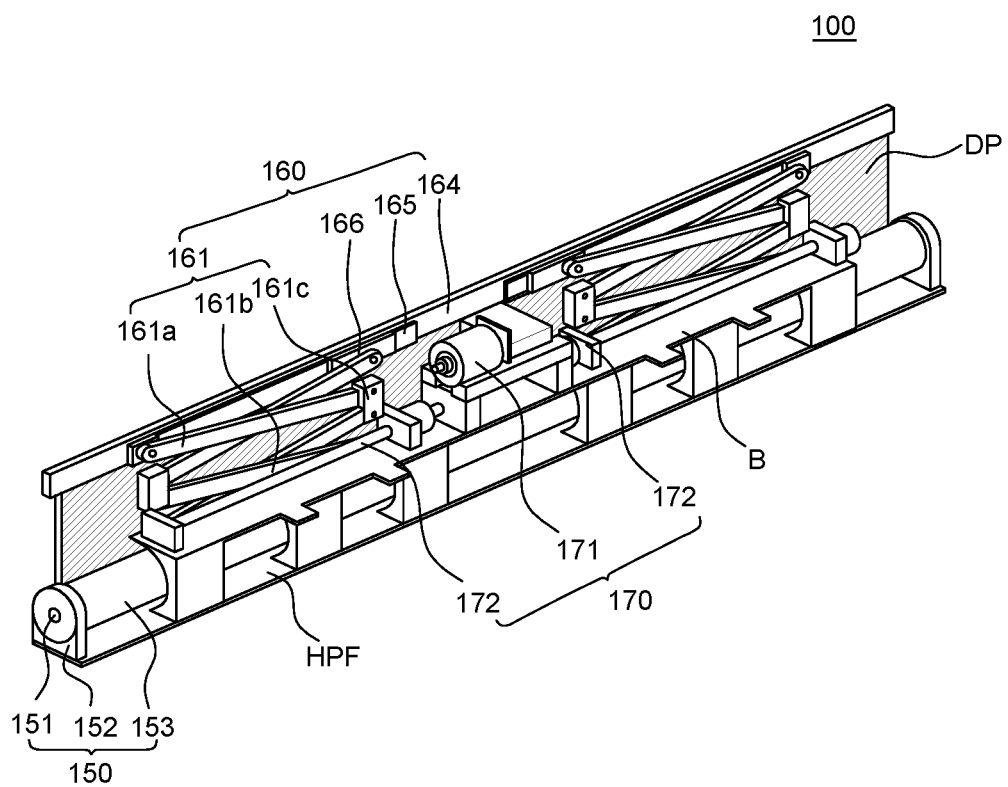
FIG. 3 is a perspective view of the display device according to an exemplary aspect of the present disclosure.

FIG. 3 is a perspective view of the display device according to an exemplary aspect of the present disclosure.

FIG. 2 illustrates that the display part DP of the display device 100 is in the fully unwound state and FIG. 3 illustrates that the display part DP of the display device 100 is in the fully wound state.

Referring to FIG. 2 and FIG. 3, the driving part MP may include a roller unit 150, a lifting unit 160, and a motion converting unit 170.

A roller 153 of the roller unit 150 rotates clockwise or counterclockwise to wind or unwind the display part DP fixed to the roller 153. The roller unit 150 may include the roller 153, a roller support unit 152, and a rotation shaft 151.

The roller 153 is a member on which the display part DP is wound. The roller 153 may have, for example, a cylindrical shape. A lower edge of the display part DP may be fixed to the roller 153. In this case, when the roller 153 rotates, the display part DP whose lower edge is fixed to the roller 153 may be wound around the roller 153. On the contrary, when the roller 153 rotates in the opposite direction, the display part DP wound around the roller 153 may be unwound from the roller 153.

The roller support unit 152 may support the roller 153 at both sides of the roller 153. Specifically, the roller support unit 152 may be disposed on a bottom surface HPF of the housing part HP, but is not limited thereto. Also, upper side surfaces of the roller support unit 152 may be coupled with both side ends of the rotation shaft 151 fastened with the roller 153. That is, the roller 153 may be rotatably coupled with the roller support unit 152. The roller support unit 152 may support the roller 153 so as to be spaced apart from the bottom surface HPF of the housing part HP.

The lifting unit 160 moves the display part DP up and down according to driving of the roller unit 150. Here, the lifting unit 160 may include a link unit 161, a head bar 164, a slide rail 165 and a slider 166.

Further, the link unit 161 of the lifting unit 160 may include a plurality of links 161a and 161b and a hinge 161c connecting each of the plurality of links 161a and 161b. Specifically, the plurality of links 161a and 161b includes a first link 161a and a second link 161b. The first link 161a and the second link 161b cross each other in the form of scissors so as to be rotatably fastened with each other through the hinge 161c. Thus, when the link unit 161 moves up and down, the plurality of links 161a and 161b may rotate in a direction to be farther from or closer to each other.

The head bar 164 of the lifting unit 160 may be fixed to an uppermost end of the display part DP. The head bar 164 may be connected to the link unit 161 and may move the display part DP up and down according to a rotation of the plurality of links 161a and 161b of the link unit 161. That is, the display part DP may be moved up and down by the head bar 164 and the link unit 161.

The head bar 164 covers only a part of a surface adjacent to an uppermost edge of the display part DP in order not to cover images displayed on a front surface of the display part DP. The display part DP and the head bar 164 may be fixed to each other with screws, but the present disclosure is not limited thereto.

The slide rail 165 of the lifting unit 160 may provide a movement path of the plurality of links 161a and 161b. One of the plurality of links 161a and 161b may be rotatably fastened with the slide rail 165 so that motion of the link may be guided along a path defined by the slide rail 165. One of the plurality of links 161a and 161b may be fastened with the slider 166 that can move along the slide rail 165 so that the link may move along the path defined by the slide rail 165.

The motion converting unit 170 may include a motor 171 and a rotary unit 172.

The motor 171 may be fixed to a portion of a base B. The motor 171 is connected to a power generation unit, such as a separate external power source or a built-in battery, which supplies power to the motor 171. The motor 171 may generate a torque to provide a driving force to the rotary unit 172.

The rotary unit 172 is connected to the motor 171 and is configured to convert a rotational motion from the motor 171 into a linear reciprocating motion. That is, the rotational motion of the motor 171 may be converted into the linear reciprocating motion by a structure fixed to the rotary unit 172. For example, the rotary unit 172 may be implemented by a shaft and a ball screw including a nut which is fastened with the shaft, but is not limited thereto.

The motion converting unit 170 operates in line with the lifting unit 160 to lift and lower a display panel 120. That is, for example, the link unit 161 of the lifting unit 160 has a link structure to receive the driving force from the motion converting unit 170 to repeatedly perform a folding or unfolding operation. When the display panel 120 is fully wound around the roller 153, the link unit 161 of the lifting unit 160 maintains a folded state. That is, when the display panel 120 is fully wound around the roller 153, the lifting unit 160 has a minimum height. When the display panel 120 is fully unwound from the roller 153, the link unit 161 of the lifting unit 160 maintains an unfolded state. That is, when the display panel 120 is fully unwound from the roller 153, the lifting unit 160 has a maximum height.

A winding process of the display part DP will be described with reference to FIG. 2 and FIG. 3. In order to wind the display part DP in the fully unwound state illustrated in FIG. 2, the roller 153 may rotate so that the display part DP may be wound around the roller 153. Further, in order to supply an additional force, the motor 171 of the motion converting unit 170 may be driven. As the motor 171 is driven, a structure of the rotary unit 172 may undergo a linear motion. That is, a part of the rotary unit 172 to which one end of the second link 161b is connected may undergo a linear motion. Therefore, the one end of the second link 161b may move toward the motor 171 and thus the plurality of links 161a and 161b may be folded so that the height of the link unit 161 may be reduced. Further, while the plurality of links 161a and 161b is folded, the head bar 164 connected to the first link 161a is also lowered and one end of the display part DP connected to the head bar 164 is also lowered. As such, the display part DP may be wound by the above-described process.

An unwinding process of the display part DP will be described. In order to unwind the display part DP in the fully wound state illustrated in FIG. 3, the roller 153 may rotate so that the display part DP may be unwound from the roller 153. Further, in order to supply an additional force, the motor 171 of the motion converting unit 170 may be driven. As the motor 171 is driven, the structure of the rotary unit 172 may undergo a linear motion. That is, a part of the rotary unit 172 to which one end of the second link 161b is connected may undergo a linear motion. Therefore, the one end of the second link 161b may move in a direction to be farther from the motor 171 and thus the plurality of links 161a and 161b may be unfolded so that the height of the link unit 161 may be increased. Further, while the plurality of links 161a and 161b is unfolded, the head bar 164 connected to the first link 161a may also be lifted and the one end of the display part DP connected to the head bar 164 may also be lifted. As such, the display part DP may be unwound by the above-described process.

Referring to FIG. 2 and FIG. 3, the lower edge of the display part DP may be connected to the roller 153. Therefore, as the roller 153 rotates, the display part DP may be wound around the roller 153 or the display part DP wound around the roller 153 may be unwound from the roller 153. In some exemplary aspects, the driving unit MP having a different structure other than the above-described driving unit MP may be applied to the display device 100. That is, the roller unit 150, the lifting unit 160, and the motion converting unit 170 may be modified in configuration as long as the display part DP may be wound and unwound. Some of their components may be omitted, or other components may be added.

<Display Part>

Figure 4:
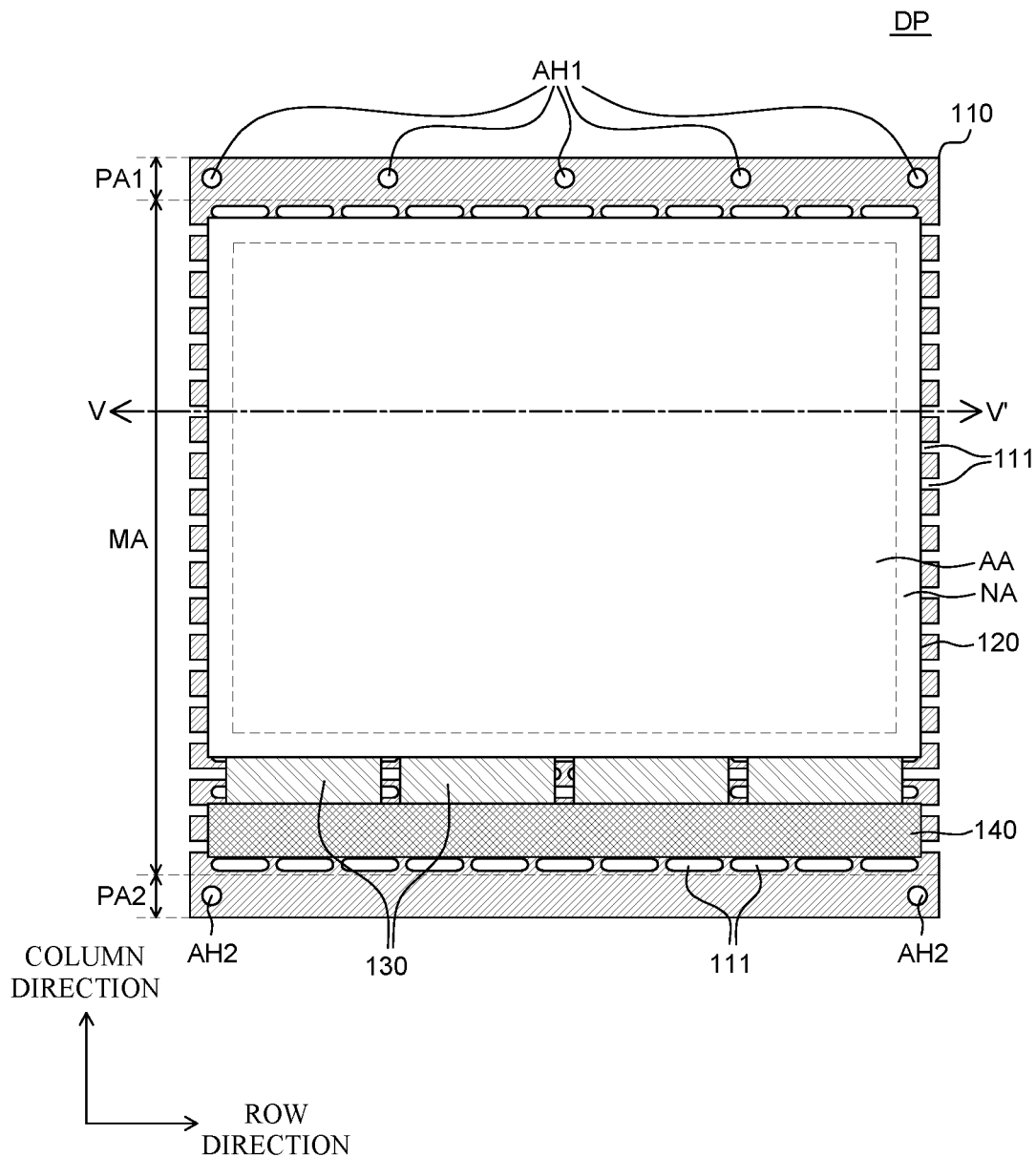
FIG. 4 is a plan view of a display part of the display device according to an exemplary aspect of the present disclosure.

FIG. 4 is a plan view of the display part of the display device according to an exemplary aspect of the present disclosure.

Figure 5:
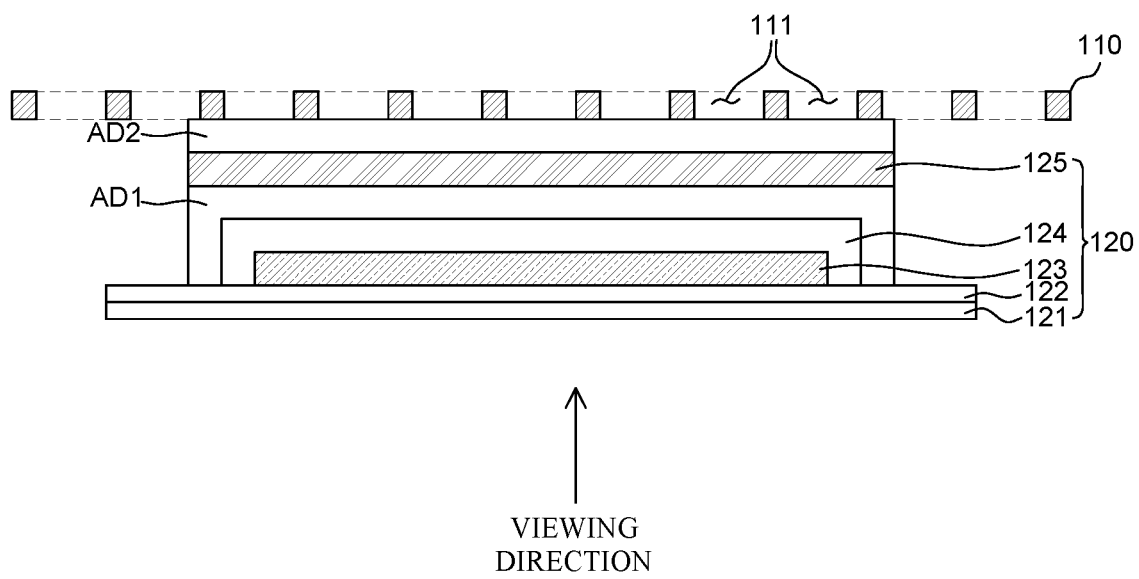
FIG. 5 is a cross-sectional view as taken along line V-V' of FIG. 4.

FIG. 5 is a cross-sectional view as taken along a line V-V' of FIG. 4.

Referring to FIG. 4, the display part DP may include a back cover 110, the display panel 120, a flexible film 130 and a printed circuit board 140.

The display panel 120 is configured to display images to the user. The display panel 120 may include display elements that display images, driving elements that drive the display elements, and lines that transmit various signals to the display elements and the driving elements. The display element may be defined in different ways depending on a type of the display panel 120. For example, when the display panel 120 is an organic light emitting display panel, the display element may be an organic light emitting element which includes an anode, an organic emission layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to an exemplary aspect of the present disclosure is a rollable display device, the display panel 120 may be implemented as a flexible display panel to be wound around or unwound from the roller 153.

The display panel 120 may include a display area AA and a non-display area NA.

The display area AA is an area where images are displayed in the display panel 120. In the display area AA, a plurality of sub-pixels constituting a plurality of pixels and circuits for driving the plurality of sub-pixels may be disposed. The plurality of sub-pixels are minimum units which configure the display area AA, and the display element may be disposed in each of the plurality of sub-pixels. For example, an organic light emitting element which includes an anode, an organic emission layer, and a cathode may be disposed in each of the plurality of sub-pixels, but the present disclosure is not limited thereto. Further, the circuits for driving the plurality of sub-pixels may include driving elements, lines, and the like. For example, the circuit may be configured by a thin film transistor, a storage capacitor, a gate line, a data line, and the like, but is not limited thereto The non-display area NA is an area where no image is displayed. In the non-display area NA, various lines and circuits for driving the organic light emitting elements of the display area AA are disposed. For example, in the non-display area NA, a link line which transmits signals to the plurality of sub-pixels and circuits of the display area AA or a driver IC, such as a gate driver IC or a data driver IC, may be disposed, but the present disclosure is not limited thereto.

The flexible film 130 is a film in which various components are disposed on a base film having flexibility. The flexible film 130 supplies signals to the plurality of sub-pixels and the circuits of the display area AA and may be electrically connected to the display panel 120. The flexible film 130 may be disposed on one end of the non-display area NA of the display panel 120 to supply a power voltage, a data voltage, or the like to the plurality of sub-pixels and the circuits of the display area AA. Although four flexible films 130 are illustrated in FIG. 4, the number of flexible films 130 may vary depending on the design and is not limited thereto.

Meanwhile, for example, a driver IC, such as a gate driver IC or a data driver IC, may be disposed on the flexible film 130. The driver IC is a component which processes data for displaying images and a driving signal for processing the data. The driver IC may be disposed in a chip on glass (COG), a chip on film (COF), or a tape carrier package (TCP) manner depending on a mounting method. For the convenience of description, it is described that the driver IC is mounted on the flexible film 130 in a chip on film manner, but the present disclosure is not limited thereto.

The printed circuit board 140 may be disposed on one end of the flexible film 130 and may be connected to the flexible film 130. The printed circuit board 140 is a component which supplies signals to the driver IC. The printed circuit board 140 supplies various signals, such as a driving signal or a data signal, to the driver IC. Various components may be disposed on the printed circuit board 140. For example, a timing controller, a power source unit, or the like may be disposed on the printed circuit board 140. Although one printed circuit board 140 is illustrated in FIG. 4, the number of printed circuit boards 140 may vary depending on the design and is not limited thereto.

Further, the back cover 110 may be disposed on rear surfaces of the display panel 120, the flexible film 130, and the printed circuit board 140 and may support the display panel 120, the flexible film 130, and the printed circuit board 140. Thus, the back cover 110 may be larger in size than the display panel 120 and may protect other components of the display part DP from an external environment. The back cover 110 may be made of a rigid material, but at least a portion of the back cover 110 may be flexible to be wound or unwound along with the display panel 120. For example, the back cover 110 may be made of a metallic material, such as Steel Use Stainless SUS or Invar, plastic, or the like, but is not limited thereto. The material of the back cover 110 may vary depending on the design as long as it can satisfy property requirements such as the amount of thermal deformation, radius of curvature, and rigidity, but is not limited thereto.

The back cover 110 may include a support area PA and a malleable area MA.

For example, the back cover 110 may include a first support area PA1 at an uppermost area of the back cover 110, a second support area PA2 at a lowermost area of the back cover 110, and the malleable area MA between the first support area PA1 and the second support area PA2, but is not limited thereto.

The first support area PA1 of the back cover 110 is the uppermost area of the back cover 110 and is fastened with the head bar. The first support area PA1 may include first fastening holes AH1 so as to be fastened with the head bar. Further, as shown in FIG. 3, screws that pass through the head bar 164 and the first fastening holes AH1 are disposed to fasten the head bar 164 and the first support area PA1 of the back cover 110. As the first support area PA1 is fastened with the head bar 164, when a link unit 162 fastened with the head bar 164 ascends or descends, the back cover 110 may also ascend or descend together with the display panel 120 attached to the back cover 110. Although five first fastening holes AH1 are illustrated in FIG. 4, the number of first fastening holes AH1 is not limited thereto. Further, although FIG. 4 illustrates that the back cover 110 is fastened with the head bar 164 using the first fastening holes AH1, the present disclosure is not limited thereto. The back cover 110 and the head bar 164 may be fastened with each other without a separate fastening hole.

The second support area PA2 of the back cover 110 is a lowermost area of the back cover 110 and is fastened with the roller 153. The second support area PA2 may include second fastening holes AH2 so as to be fastened with the roller 153. For example, screws that pass through the roller 153 and the second fastening holes AH2 are disposed to fasten the roller 153 and the second support area PA2 of the back cover 110. As the second support area PA2 is fastened with the roller 153, the back cover 110 may be wound around or unwound from the roller 153 according to a rotation of the roller 153. Although two second fastening holes AH2 are illustrated in FIG. 4, the number of second fastening holes AH2 is not limited thereto. Further, although FIG. 4 illustrates that the back cover 110 is fastened with the roller 153 using the second fastening holes AH2, the present disclosure is not limited thereto. The back cover 110 and the roller 153 may be fastened with each other without a separate fastening hole.

Further, the malleable area MA of the back cover 110 is an area which is wound around or unwound from the roller 153, together with the display panel 120. The malleable area MA may overlap at least the display panel 120 among other components of the display part DP.

A plurality of openings 111 is disposed in the malleable area MA of the back cover 110. When the display part DP is wound or unwound, the plurality of openings 111 can be deformed by a stress which is applied to the display part DP. That is, specifically, when the display part DP is wound or unwound, the malleable area MA of the back cover 110 may be deformed as the plurality of openings 111 is contracted or expanded. Further, as the plurality of openings 111 is contracted or expanded, a slip phenomenon of the display panel 120 disposed on the malleable area MA of the back cover 110 is minimized. Thus, the stress applied to the display panel 120 can be minimized.

Referring to FIG. 5, the display panel 120 may include a substrate 121, a buffer layer 122, a pixel unit 123, an encapsulation layer 124 and an encapsulation substrate 125.

The substrate 121 may serve as a base member to support various components of the display panel 120 and may be made of an insulating material. The substrate 121 may be made of a flexible material so that the display panel 120 may be wound or unwound. For example, the substrate 121 may be made of a plastic material, such as polyimide (PI).

The buffer layer 122 may suppress diffusion of moisture and/or oxygen permeating from the outside of the substrate 121. The buffer layer 122 may be formed as a single layer or a multilayer of silicon oxide (SiOx) and silicon nitride SiNx, but is not limited thereto.

The pixel unit 123 may include a plurality of organic light emitting elements and circuits for driving the organic light emitting elements. The pixel unit 123 may be disposed in an area corresponding to the display area. Each organic light emitting element may include an anode, an organic emission layer and a cathode.

The anode may supply holes into the organic emission layer and may be made of a conductive material having a high work function. For example, the anode may be made of tin oxide TO, indium tin oxide ITO, indium zinc oxide IZO, indium zinc tin oxide ITZO, or the like, but is not limited thereto.

The organic emission layer may receive holes from the anode and electrons from the cathode, and emit light. The organic emission layer may be one of a red organic emission layer, a green organic emission layer, a blue organic emission layer and a white organic emission layer, depending on the color of light emitted from the organic emission layer. If the organic emission layer is a white organic emission layer, color filters of various colors may be further provided.

The cathode may supply electrons into the organic emission layer and may be made of a conductive material having a low work function. For example, the cathode may be made of any one or more materials selected from the group consisting of metals, such as magnesium (Mg), silver (Ag), and aluminum (Al), and alloys thereof, but is not limited thereto.

The display panel 120 may be classified into a top emission type or a bottom emission type depending on a transmission direction of light emitted from the organic light emitting element.

With the top emission type panel, light emitted from the organic light emitting element may be emitted to an upper portion of the substrate 121 on which the organic light emitting element is disposed. If the display panel 120 is of top emission type, a reflective layer may be further provided under the anode. This is to allow light emitted from the organic light emitting element to travel to the upper portion of the substrate 121, i.e., toward the cathode.

With the bottom emission type panel, light emitted from the organic light emitting element is emitted to a lower portion of the substrate 121 on which the organic light emitting element is formed. If the display panel 120 is of bottom emission type, the anode may be made of a transparent conductive material only and the cathode may be made of a metal material having high reflectivity. This is to allow light emitted from the organic light emitting element to travel to the lower portion of the substrate 121.

Hereafter, for the convenience of description, the display device 100 according to an exemplary aspect of the present disclosure will be described as a bottom emission type display device 100, but is not limited thereto.

In the pixel unit 123, a circuit for driving organic light emitting elements may be disposed. The circuit may be composed of a thin film transistor, a storage capacitor, a gate line, a data line, a power line and the like. However, the configuration of the circuit may vary depending on the design of the display device 100.

The encapsulation layer 124 may be disposed on the pixel unit 123 so as to cover the pixel unit 123. The encapsulation layer 124 may seal the organic light emitting elements of the pixel unit 123. The encapsulation layer 124 may protect the organic light emitting elements of the pixel unit 123 against external moisture, oxygen, impacts and the like. The encapsulation layer 124 may be formed by alternately laminating a plurality of inorganic layers and a plurality of organic layers. For example, the inorganic layers may be made of inorganic materials, such as silicon nitride SiNx, silicon oxide SiOx and aluminum oxide AlOx), but are not limited thereto. For example, the organic layers may be made of epoxy-based or acryl-based polymers, but are not limited thereto.

The encapsulation substrate 125 may be disposed on the encapsulation layer 124. The encapsulation substrate 125 may protect the organic light emitting elements of the pixel unit 123 together with the encapsulation layer 124. The encapsulation substrate 125 may protect the organic light emitting elements of the pixel unit 123 against external moisture, oxygen, impacts and the like. The encapsulation substrate 125 may be made of a metal material, which has high corrosion resistance and is easily processed in the form of foil or thin film, such as aluminum (Al), nickel (Ni), chromium (Cr), and an alloy of iron (Fe) and Ni. Since the encapsulation substrate 125 is made of a metal material, the encapsulation substrate 125 may be implemented as an ultra-thin film with high resistance to external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 may be made of an adhesive material and may be a thermosetting or naturally-curable adhesive. For example, the first adhesive layer AD1 may be made of an optical clear adhesive (OCA), a pressure sensitive adhesive (PSA), or the like, but is not limited thereto.

The first adhesive layer AD1 may be disposed to cover the encapsulation layer 124 and the pixel unit 123. That is, the pixel unit 123 may be sealed by the buffer layer 122 and the encapsulation layer 124, and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, impacts and the like, together with the encapsulation layer 124 and the encapsulation substrate 125. In this case, the first adhesive layer AD1 may further contain a moisture absorbent. The moisture absorbent may include hygroscopic particles and may absorb moisture, oxygen, and the like from the outside to minimize permeation of moisture and oxygen into the pixel unit 123.

The back cover 110 may be disposed on the encapsulation substrate 125. The back cover 110 may be disposed to be in contact with the encapsulation substrate 125 of the display panel 120 to protect the display panel 120. The back cover 110 may be made of a rigid material to protect the display panel 120.

The back cover 110 may include a plurality of openings 111. The plurality of openings 111 may enable the back cover 110 to have flexibility. The plurality of openings 111 may be flexibly deformed and enable the back cover 110 to be wound around or unwound from the roller 153 along with the display panel 120.

A second adhesive layer AD2 may be disposed between the encapsulation substrate 125 and the back cover 110. The second adhesive layer AD2 may bond the encapsulation substrate 125 and the back cover 110 to each other. The second adhesive layer AD2 may be made of an adhesive material and may be a thermosetting or naturally-curable adhesive. For example, the second adhesive layer AD2 may be made of an optical clear adhesive OCA, a pressure sensitive adhesive PSA, or the like, but is not limited thereto.

FIG. 5 illustrates that the plurality of openings 111 of the back cover 110 is not filled with the second adhesive layer AD2. However, some or all of the plurality of openings 111 of the back cover 110 may be filled with the second adhesive layer AD2. If the second adhesive layer AD2 fills in the plurality of openings 111 of the back cover 110, a contact area between the second adhesive layer AD2 and the back cover 110 may increase. Thus, it is possible to suppress separation of the back cover 110.

Although not illustrated in FIG. 5, a transparent film may be further disposed on a rear surface of the substrate 121. Here, the transparent film may function to protect a front surface of the display panel 120 or minimize reflection of external light incident on the display panel 120. For example, the transparent film may be at least one of a polyethylene terephthalate PET film, an anti-reflection film, a polarizing film and a transmittance controllable film, but is not limited thereto.

Meanwhile, it is very important for a rollable display device to secure overall continuity of grounding, and it is possible to control an embedded point-to-point interface EPI noise by securing grounding of main mechanism blocks. The rollable display device includes long EPI lines and thus is vulnerable to EMI. Thus, it is important to improve EMI by enhancing grounding and using the continuity of grounding.

However, in a conventional rollable display device, discontinuity of grounding occurs in a printed circuit board. Also, discontinuity of impedance occurs in the printed circuit board due to the range of variation caused by differences in characteristic impedance between the printed circuit board and a connector. Further, a number of EMI materials for solving this problem are added, which causes an increase in cost.

In a rollable display device, a roller needs to be rotated in order to wind and unwind a display part. Such a driving of the roller makes it difficult to contact with other components.

Accordingly, in the present disclosure, a grounding unit configured to be movable is further provided inside a roller and a grounding unit is further provided under the roller. Thus, continuity of grounding is enhanced, and grounding is enhanced. That is, a movable grounding unit is provided inside the roller so that after a display part is fully wound, the grounding unit moves to the outside to be brought into contact with a roller support unit. Also, a grounding unit is provided under the roller, and the roller and the roller support unit are moved downwards to be brought into contact with the grounding unit by using tension remaining after wining of the display part. Further, a U-shaped grounding unit is further provided under the roller, and after the display part is fully wound, the U-shaped grounding unit is moved upwards to be brought into contact with the roller.

That is, according to the present disclosure, grounding is enhanced after the display part is fully unwound in order to obtain an optimal EMI result in an EMI test environment.

Hereinafter, grounding unit of the present disclosure will be described in detail with reference to the accompanying drawings.

<Grounding Unit Inside Roller>

Figure 6:
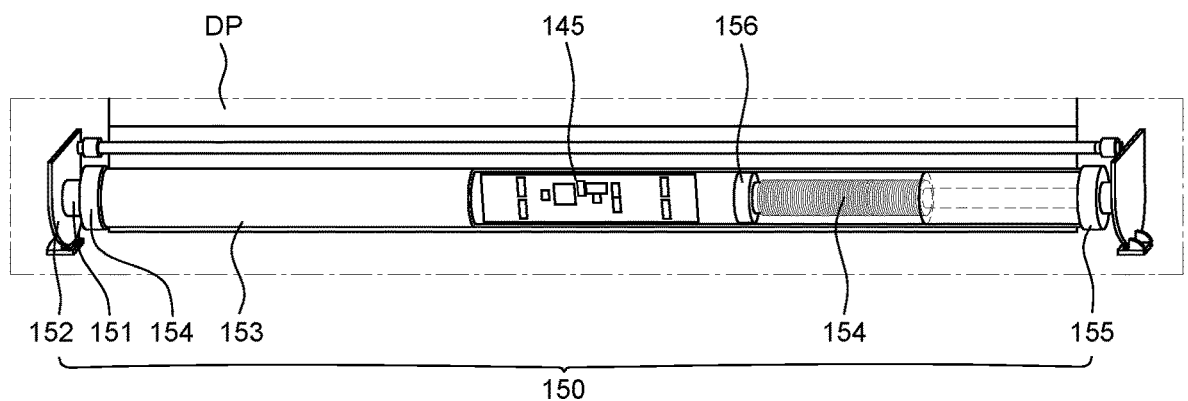
FIG. 6 is a perspective view of a roller unit of the display device according to an exemplary aspect of the present disclosure.

FIG. 6 is a perspective view of a roller unit of the display device according to an exemplary aspect of the present disclosure.

Figure 7A:
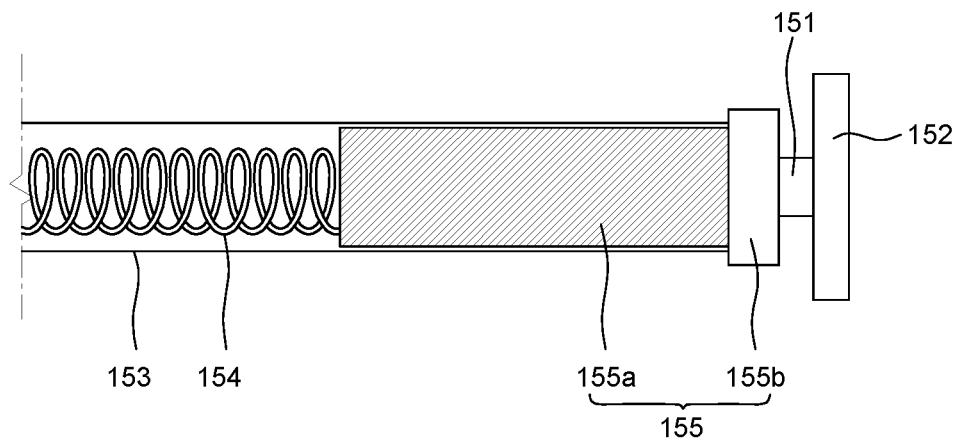
FIG. 7A and FIG. 7B are cross-sectional views illustrating a driving of the roller unit shown in FIG. 6.
Figure 7B:
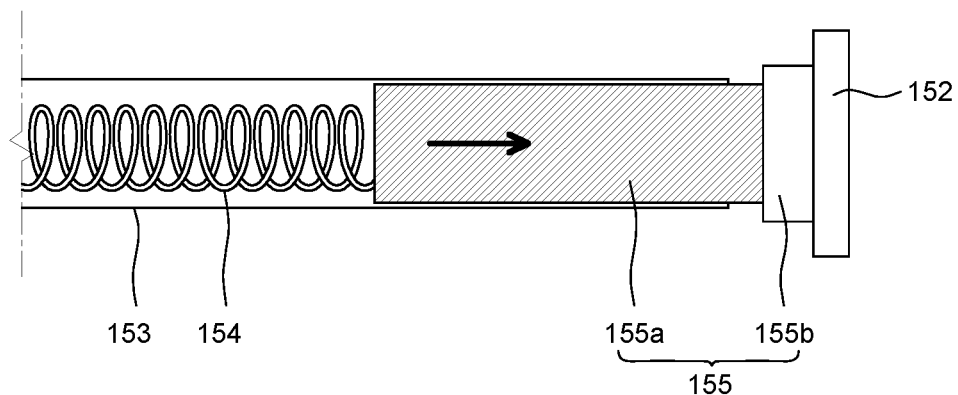

FIG. 7A and FIG. 7B are cross-sectional views illustrating a driving of the roller unit shown in FIG. 6.

FIG. 7A and FIG. 7B show a right side part of the roller unit 150 shown in FIG. 6.

FIG. 7A shows the roller unit 150 while the display part DP is in a wound state, and FIG. 7B shows the roller unit 150 while the display part DP is in an unwound state.

Referring to FIG. 6, FIG. 7A and FIG. 7B, the roller unit 150 may include the roller 153, the roller support unit 152 and the rotation shaft 151.

The roller 153 is a member on which the display part DP is wound. The roller 153 may have, for example, a cylindrical shape. A lower edge of the display part DP may be fixed to the roller 153. In this case, when the roller 153 rotates, the display part DP whose lower edge is fixed to the roller 153 may be wound around the roller 153. On the contrary, when the roller 153 rotates in the opposite direction, the display part DP wound around the roller 153 may be unwound from the roller 153.

The roller support unit 152 may support the roller 153 at both sides of the roller 153. Specifically, the roller support unit 152 may be disposed on the bottom surface of the housing part, but is not limited thereto. Also, upper side surfaces of the roller support unit 152 may be coupled with both side ends of the rotation shaft 151 fastened with the roller 153. That is, the roller 153 may be rotatably coupled with the roller support unit 152. The roller support unit 152 may support the roller 153 so as to be spaced apart from the bottom surface of the housing part.

That is, the roller 153 has a cylindrical shape, and, thus, the display part DP is wound around its outer peripheral surface and the rotation shaft 151 is fastened at the centers of both side surfaces of the roller 153. Therefore, the roller 153 may be rotatably coupled with the roller support unit 152. One side of the rotation shaft 151 may be fastened at the center of a side surface of the roller 153, and the other side may be rotatably coupled with the roller support unit 152, but the present disclosure is not limited thereto. The rotation shaft 151 may be configured to be rotated together with the roller 153 when the roller 153 rotates, but is not limited thereto.

A torsional elastic member 154 may be disposed inside the roller 153 so that torsional elasticity may be generated when the roller 153 rotates. One end of the torsional elastic member 154 may be fixed to a cylinder member 156 and the other end may be fixed to a first grounding unit 155. However, the present disclosure is not limited thereto. The other end of the torsional elastic member 154 may not be fixed to the first grounding unit 155.

The torsional elastic member 154 may include a torsion spring, but is not limited thereto.

The first grounding unit 155 is made of a metal material. The first grounding unit 155 may include, for example, a body 155*a* that is accommodated inside the roller 153 so as to be movable and a contact portion 155*b* that is connected to an outer surface of the body 155*a* and contacts with the roller support unit 152 as the body 155*a* moves. However, the present disclosure is not limited thereto.

The body 155*a* and the contact portion 155*b* may be configured as one body. However, the present disclosure is not limited thereto.

The body 155*a* and the contact portion 155*b* may be cylindrical in shape, and the body 155*a* may have a smaller aperture than the roller 153, and the contact portion 155*b* may have a greater aperture than the roller 153. Since the contact portion 155*b* is designed to have a greater aperture than the roller 153, the contact portion 155*b* is not slid into the roller 153. Also, the contact portion 155*b* may have a large contact area with the roller support unit 152, which makes side contact easy.

The contact portion 155*b* may include a hole through which the rotation shaft 151 may pass.

For example, referring to FIG. 7A, while the display part DP is in a wound state, the first grounding unit 155 is spaced apart from the roller support unit 152.

On the other hand, referring to FIG. 7B, while the display part DP is in an unwound state, the torsional elastic member 154 fixed to the cylinder member 156 is compressed in a rotation direction according to a rotation of the roller 153. Also, the torsional elastic member 154 pushes the first grounding unit 155 to the outside by elasticity. Therefore, the torsional elastic member 154 is brought into contact with the grounded roller support unit 152 and grounded. As the display part DP is gradually moved upwards, a contact between the first grounding unit 155 and the roller support unit 152 may be enhanced, and, thus, grounding may be enhanced.

Referring to FIG. 7A again, when winding of the display part DP starts, the roller 153 rotates in the opposite direction and the torsional elastic member 154 is decompressed. Therefore, the first grounding unit 155 returns to its original position and the contact between the first grounding unit 155 and the roller support unit 152 may be cancelled. However, the present disclosure is not limited to the above-described method.

That is, in an exemplary aspect of the present disclosure, the first grounding unit 155 configured to be movable is further provided inside the roller 153. Also, as the display part DP is unwound, the first grounding unit 155 is moved to the outside by elasticity of the torsional elastic member 154 so as to be brought into contact with the roller support unit 152.

A control PCB C-PCB 145 may be disposed inside the roller 153, or may be disposed outside the roller 153 within the housing part. Otherwise, the C-PCB 145 may be disposed to be brought into direct contact with the printed circuit board.

<Grounding Unit Under Roller>

Figure 8:
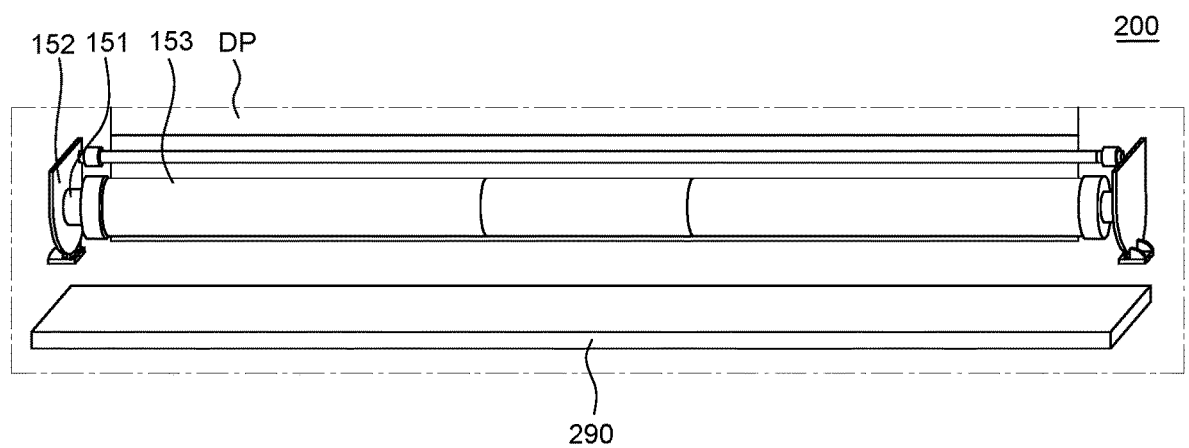
FIG. 8 is a perspective view of a roller unit of a display device according to another exemplary aspect of the present disclosure.

FIG. 8 is a perspective view of a display device according to another exemplary aspect of the present disclosure.

Figure 9A:
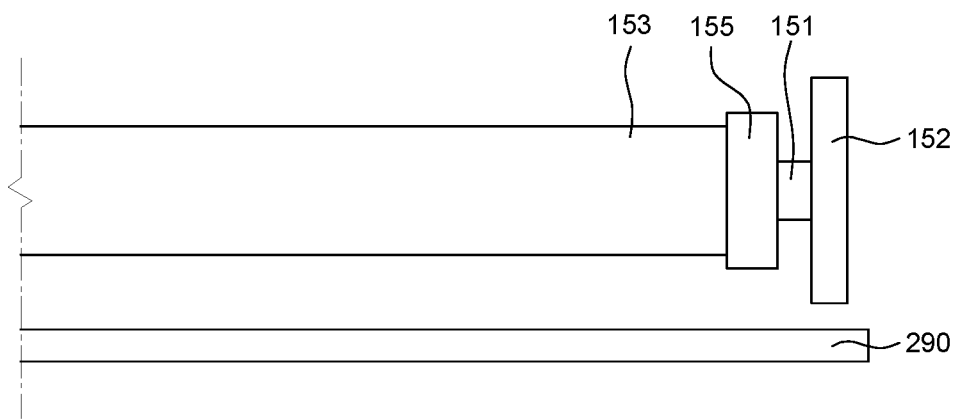
FIG. 9A and FIG. 9B are cross-sectional views illustrating a driving of the roller unit shown in FIG. 8.
Figure 9B:
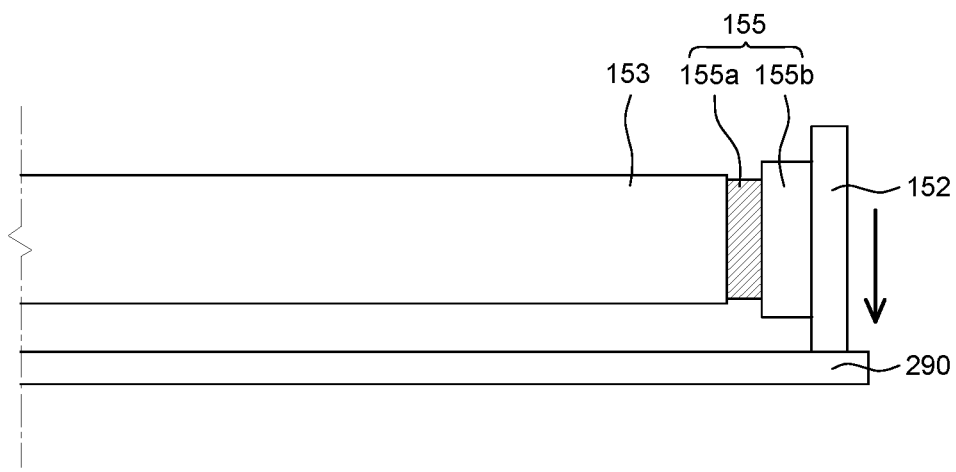

FIG. 9A and FIG. 9B are cross-sectional views illustrating a driving of the roller unit shown in FIG. 8.

FIG. 9A and FIG. 9B show a right side part of a roller unit shown in FIG. 8.

FIG. 9A shows the roller unit while the display part DP is in a wound state, and FIG. 9B shows the roller unit while the display part DP is in the fully unwound state.

A display device 200 shown in FIG. 8, FIG. 9A and FIG. 9B has substantially the same configuration as the display device 100 shown in FIG. 6, FIG. 7A and FIG. 7B except that a second grounding unit 290 is further provided under the roller 153. Therefore, the same components are designated by the same reference numerals, and a repeated description thereof is omitted.

Referring to FIG. 8, FIG. 9A and FIG. 9B, in the display device 200 according to another exemplary aspect of the present disclosure, the second grounding unit 290 is further provided under the roller 153.

The second grounding unit 290 has a plate shape corresponding in length to the roller 153 and may be disposed under the roller 153 and may be grounded.

The second grounding unit 290 may be made of a metal material.

The second grounding unit 290 may be extended to the roller support unit 152 at both sides of the roller 153 and may be grounded to the roller support unit 152.

For example, referring to FIG. 9A, while the display part DP is in a wound state, the first grounding unit 155 is spaced apart from the roller support unit 152. Also, the second grounding unit 290 is spaced apart from the roller support unit 152.

On the other hand, referring to FIG. 9B, while the display part DP is in an unwound state, the torsional elastic member is compressed in a rotation direction according to a rotation of the roller 153. Also, the torsional elastic member pushes the first grounding unit 155 to the outside by elasticity. Therefore, the torsional elastic member is brought into contact with the grounded roller support unit 152 and grounded. Then, the roller 153 and the roller support unit 152 are moved downwards by using the remaining tension of the torsional elastic member so that the roller support unit 152 is brought into contact with the second grounding unit 290 and grounded. That is, if a predetermined amount of tension is applied after the display part DP is unwound, the roller 153 and the roller support unit 152 may be moved downwards. Thus, the roller support unit 152 may be brought into contact with the second grounding unit 290 and grounding may be enhanced.

Referring to FIG. 9A again, when winding of the display part DP starts, the remaining tension dissipates. Thus, the roller 153 and the roller support unit 152 are moved upwards and a contact between the roller support unit 152 and the second grounding unit 290 is released. When the torsional elastic member is decompressed as the roller 153 rotates in the opposite direction, the first grounding unit 155 may return to its original position.

Figure 10A:
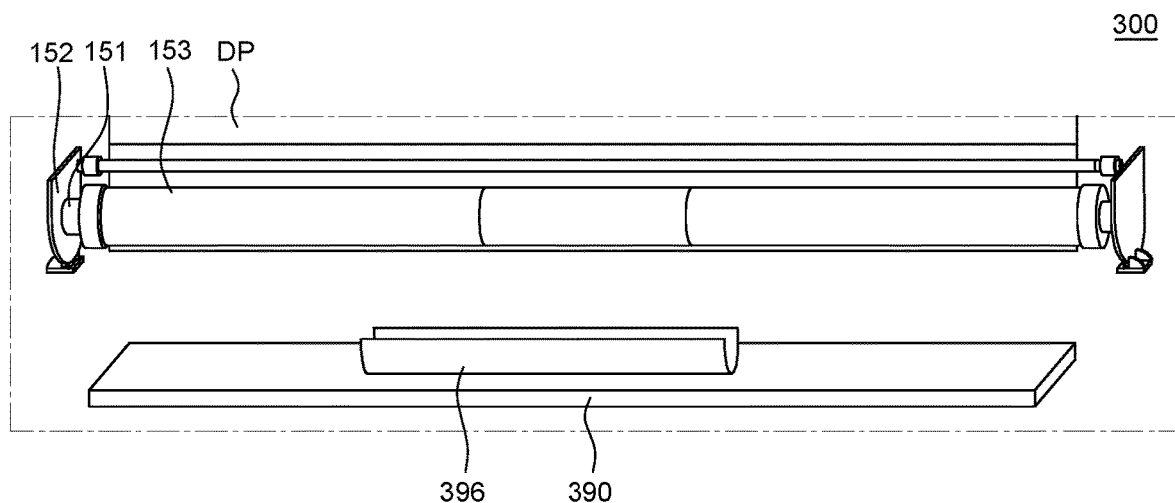
FIG. 10A and FIG. 10B are perspective views illustrating a driving of a roller unit according to yet another exemplary aspect of the present disclosure.
Figure 10B:
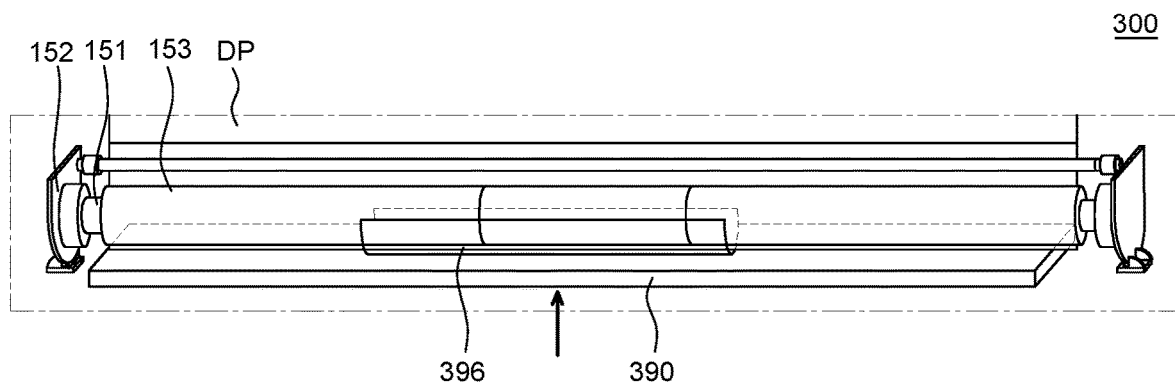

FIG. 10A and FIG. 10B are perspective views illustrating a driving of a roller unit according to yet another exemplary aspect of the present disclosure.

FIG. 10A shows the roller unit while the display part DP is in a wound state, and FIG. 10B shows the roller unit while the display part DP is in the fully unwound state.

A display device 300 shown in FIG. 10A and FIG. 10B has substantially the same configuration as the display device 200 shown in FIG. 8, FIG. 9A and FIG. 9B except that a U-shaped third grounding unit 396 is further provided under the roller 153. Therefore, the same components are designated by the same reference numerals, and a repeated description thereof is omitted.

Referring to FIG. 10A and FIG. 10B, in the display device 300 according to yet another exemplary aspect of the present disclosure, a second grounding unit 390 and the third grounding unit 396 are further provided under the roller 153.

The second grounding unit 390 may have a plate shape and may be disposed under the roller 153 in a longitudinal direction of the roller 153 and grounded.

The third grounding unit 396 may have a U-shape, and may be disposed on the second grounding unit 390 so as to be in contact with the second grounding unit 390.

The third grounding unit 396 may have the same shape as the roller 153, but is not limited thereto.

The second grounding unit 390 and the third grounding unit 396 may be made of a metal material.

The second grounding unit 390 may have a smaller length than the roller 153. The third grounding unit 396 may have a smaller length than the second grounding unit 390, but is not limited thereto.

For example, referring to FIG. 10A, while the display part DP is in a wound state, the first grounding unit is spaced apart from the roller support unit 152. Also, the second grounding unit 390 and the third grounding unit 396 are spaced apart from the roller 153.

On the other hand, referring to FIG. 10B, after the display part DP is fully unwound, the second grounding unit 390 is moved upwards by using a switch or the like. Thus, the roller 153 is brought into contact with the third grounding unit 396 and grounded. That is, when unwinding of the display part DP is completed, the second grounding unit 390 is automatically moved upwards so that the roller 153 is brought into contact with the third grounding unit 396.

Referring to FIG. 10A again, when winding of the display part DP starts, the second grounding unit 390 is moved downwards so that a contact between the roller 153 and the third grounding unit 396 is released.

<EMI Measurement Result>

Figure 11A:
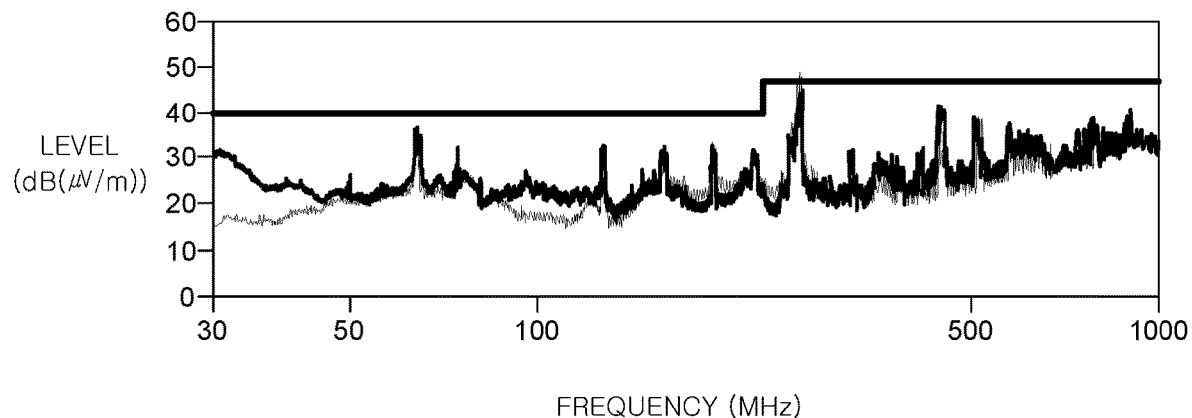
FIG. 11A and FIG. 11B are graphs showing EMI levels depending on the frequency.
Figure 11B:
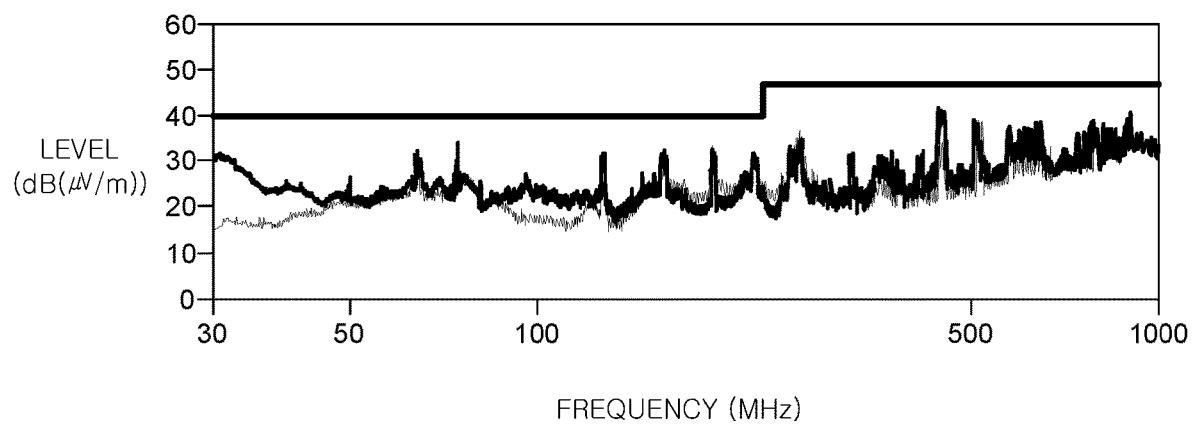

FIG. 11A and FIG. 11B are graphs showing EMI levels depending on the frequency.

Figure 12A:
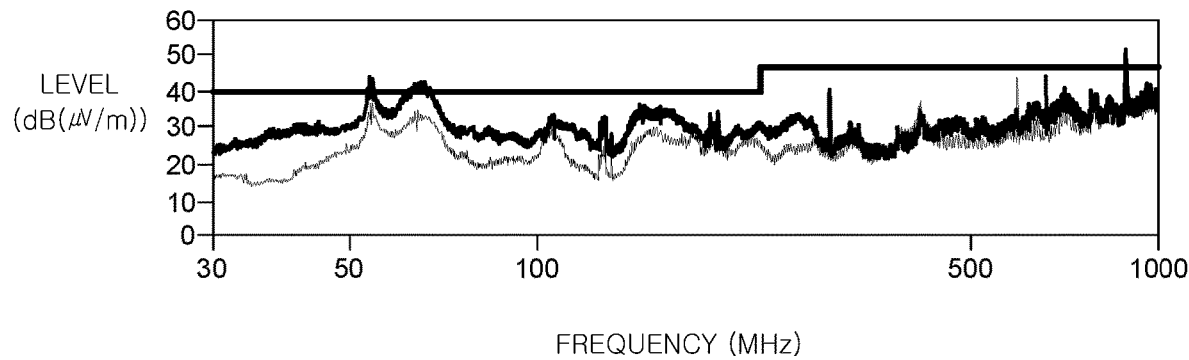
FIG. 12A and FIG. 12B are graphs showing EMI levels depending on the frequency.
Figure 12B:
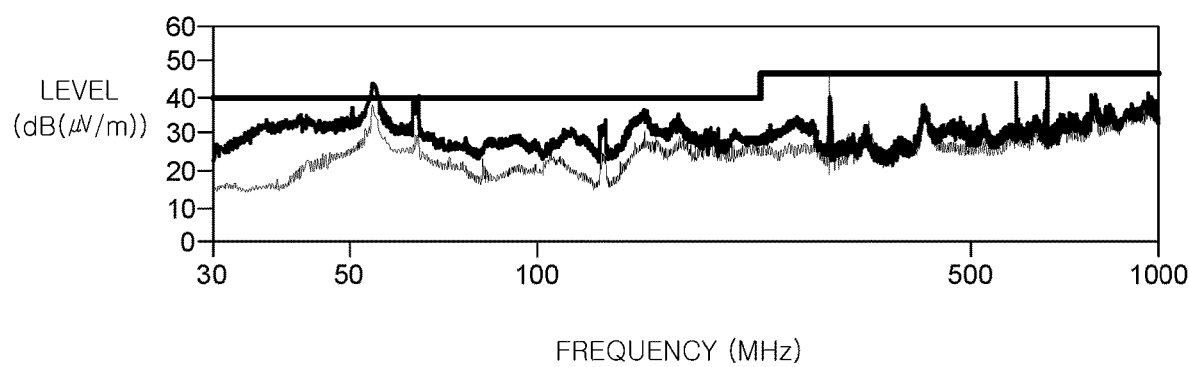

FIG. 12A and FIG. 12B are graphs showing EMI levels depending on the frequency.

FIGS. 11A and 11B show EMI levels depending on the frequency in a display part including a roller unit, and FIGS. 12A and 12B show EMI levels depending on the frequency in a display device including a set.

FIG. 11A and FIG. 12A show EMI levels according to Comparative Aspect, and FIG. 11B and FIG. 12B show EMI levels according to Exemplary Aspect.

In FIGS. 11A and 11B and FIGS. 12A and 12B, bold graphs show the results when using a vertical type antenna and slim graphs show the results when using a horizontal type antenna.

That is, FIG. 11A and FIG. 12A show EMI levels according to Comparative Aspect, and the bold graphs show the results when using a vertical type antenna and the slim graphs show the results when using a horizontal type antenna.

Also, FIG. 11B and FIG. 12B show EMI levels according to Exemplary Aspect, and the bold graphs show the results when using a vertical type antenna and the slim graphs show the results when using a horizontal type antenna.

In FIGS. 11A and 11B and FIGS. 12A and 12B, lines above the graphs represent reference values allowed for EMI levels.

The reference values may be located at 40 dB in a frequency range of from 30 MHz to 230 MHz and at about 47 dB in a frequency range of from 230 MHz to 1,000 MHz.

Referring to FIG. 11A and FIG. 11B, it can be seen that the display part including the roller unit shows a decrease in deviation in EMI levels over the entire frequency range and thus shows the maximized effect of improving EMI in Exemplary Aspect of the present disclosure as compared with Comparative Aspect. In particular, it can be seen that the EMI levels may exceed the reference values in Comparative Aspect, whereas a deviation in EMI levels decreases below the reference values over the entire frequency range in Exemplary Aspect.

Further, it can be seen that the effect of improving EMI is irrelevant to the type of antenna.

Referring to FIG. 12A and FIG. 12B, it can be seen even the display device including the set shows a decrease in deviation in power noise and EMI noise in Exemplary Aspect of the present disclosure as compared with Comparative Aspect. In particular, it can be seen that the EMI levels may exceed the reference values in several frequency bands in Comparative Aspect, whereas a deviation in EMI noise decreases in Exemplary Aspect. Also, it can be seen that as for the horizontal type antenna, the EMI levels are suppressed below the reference values over the entire frequency range.

In Comparative Aspect, a deviation in EMI levels occurs and a margin with respect to the reference values is insufficient. However, in Exemplary Aspect of the present disclosure, grounding is enhanced, and, thus, a margin of 6 dB with respect to the reference values may be stably secured.

The exemplary aspects of the present disclosure can also be described as follows:

According to an aspect of the present disclosure, there is provided a display device. The display device includes a display panel including a display part including a display panel in which a plurality of pixels is defined; a roller fastened with the display part and configured to wind or unwind the display part; a roller support unit configured to support the roller at both sides of the roller; and a first grounding unit including a body accommodated inside the roller so as to be movable and a contact portion connected to an outer surface of the body and brought into contact with the roller support unit as the body moves.

The display part may include a back cover disposed on a rear surface of the display panel.

The display device may further include a torsional elastic member disposed inside the roller so that torsional elasticity is generated when the roller rotates.

The torsional elastic member may include a torsion spring.

One end of the torsional elastic member may be fixed to a cylinder member and the other end may be fixed to the first grounding unit.

The body and the contact portion may be cylindrical in shape, and the body may have a smaller aperture than that of the roller, and the contact portion may have a greater aperture than that of the roller.

The display device may further include a rotation shaft fastened at a center of a side surface of the roller and rotatably coupled with the roller support unit.

The contact portion may include a hole through which the rotation shaft passes.

The first grounding unit may be spaced apart from the roller support unit while the display part may be in a wound state.

The first grounding unit may be moved to an outside by elasticity of the torsional elastic member so as to be brought into contact with the roller support unit as the display part is unwound.

The display device may further include a second grounding unit disposed under the roller.

The second grounding unit may have a plate shape corresponding in length to the roller and may be disposed under the roller.

The second grounding unit may be extended to the roller support unit at both sides of the roller.

The second grounding unit may be spaced apart from the roller support unit while the display part may be in the wound state.

After the display part may be unwound, the roller and the roller support unit may be moved downwards by using remaining tension of the torsional elastic member so that the roller support unit may be brought into contact with the second grounding unit and grounded.

The second grounding unit may have a plate shape and maya be disposed under the roller in a longitudinal direction of the roller.

The display device may further include a third grounding unit having a U-shape and disposed on the second grounding unit to be brought into contact with the second grounding unit.

The third grounding unit may have the same shape as the roller, and the second grounding unit may have a smaller length than the roller, and the third grounding unit may have a smaller length than the second grounding unit.

After the display part may be unwound, the second grounding unit may be moved upwards so as to be brought into contact with the third grounding unit.

According to another aspect of the present disclosure, there is provided a display device. The display device includes a display part including a display panel that displays images and a back cover that is disposed on a rear surface of the display panel; a roller fastened with the back cover and configured to wind or unwind the display part; a roller support unit configured to support the roller at both sides of the roller; a first grounding unit accommodated inside the roller so as to be movable and configured to be brought into contact with the roller support unit when the display part is unwound; and a second grounding unit disposed under the roller and the roller support unit and configured to be brought into contact with the roller or the roller support unit after the display part is unwound.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display part including a display panel in which a plurality of pixels is defined;
    a roller fastened with the display part and configured to wind or unwind the display part;
    a roller support unit configured to support the roller at both sides of the roller; and
    a first grounding unit including a body accommodated inside the roller so as to be movable and a contact portion connected to an outer surface of the body and brought into contact with the roller support unit as the body moves.

2. The display device according to claim 1, wherein the display part includes a back cover disposed on a rear surface of the display panel.

3. The display device according to claim 1, further comprising a torsional elastic member disposed inside the roller and generating torsional elasticity when the roller rotates.

4. The display device according to claim 3, wherein the torsional elastic member includes a torsion spring.

5. The display device according to claim 3, wherein one end of the torsional elastic member is fixed to a cylinder member and another end is fixed to the first grounding unit.

6. The display device according to claim 3, wherein the first grounding unit is spaced apart from the roller support unit while the display part is in a wound state.

7. The display device according to claim 6, wherein the first grounding unit is moved to an outside by elasticity of the torsional elastic member so as to be brought into contact with the roller support unit as the display part is unwound.

8. The display device according to claim 7, further comprising a second grounding unit disposed under the roller.

9. The display device according to claim 8, wherein the second grounding unit has a plate shape corresponding in length to the roller and is disposed under the roller.

10. The display device according to claim 8, wherein the second grounding unit is extended to the roller support unit at both sides of the roller.

11. The display device according to claim 8, wherein the second grounding unit is spaced apart from the roller support unit while the display part is in the wound state.

12. The display device according to claim 11, wherein, after the display part is unwound, the roller and the roller support unit are moved downwards by using remaining tension of the torsional elastic member so that the roller support unit is brought into contact with the second grounding unit and grounded.

13. The display device according to claim 8, wherein the second grounding unit has a plate shape and is disposed under the roller in a longitudinal direction of the roller.

14. The display device according to claim 13, further comprising a third grounding unit having a U-shape and disposed on the second grounding unit to be brought into contact with the second grounding unit.

15. The display device according to claim 14, wherein the third grounding unit has the same shape as the roller, and
   wherein the second grounding unit has a smaller length than the roller, and the third grounding unit has a smaller length than the second grounding unit.

16. The display device according to claim 14, wherein after the display part is unwound, the second grounding unit is moved upwards so as to be brought into contact with the third grounding unit.

17. The display device according to claim 1, wherein the body and the contact portion are cylindrical in shape, and
   wherein the body has a smaller aperture than that of the roller, and the contact portion has a greater aperture than that of the roller.

18. The display device according to claim 1, further comprising a rotation shaft fastened at a center of a side surface of the roller and rotatably coupled with the roller support unit.

19. The display device according to claim 18, wherein the contact portion includes a hole through which the rotation shaft passes.

20. A display device, comprising:
   a display part including a display panel that displays images and a back cover that is disposed on a rear surface of the display panel;
   a roller fastened with the back cover and configured to wind or unwind the display part;
   a roller support unit configured to support the roller at both sides of the roller;
   a first grounding unit accommodated inside the roller so as to be movable and configured to be brought into contact with the roller support unit when the display part is unwound; and
   a second grounding unit disposed under the roller and the roller support unit and configured to be brought into contact with the roller or the roller support unit after the display part is unwound.

* * * * *